United States Patent [19]

Kiriseko

[11] Patent Number: 4,473,940

[45] Date of Patent: Oct. 2, 1984

[54] METHOD OF PRODUCING A SEMICONDUCTOR DEVICE

[75] Inventor: Tadashi Kiriseko, Kanagawa, Japan

[73] Assignee: Fujitsu Limited, Kawasaki, Japan

[21] Appl. No.: 425,651

[22] Filed: Sep. 28, 1982

[30] Foreign Application Priority Data

Sep. 30, 1981 [JP] Japan .................................. 56-155048

[51] Int. Cl.³ .................... H01L 21/20; H01L 21/302; H01L 21/76

[52] U.S. Cl. .............................. 29/576 W; 29/576 E; 29/578; 29/580; 29/591; 148/175; 148/187; 156/643; 156/653; 156/657; 357/49; 357/50

[58] Field of Search ................. 29/576 E, 576 W, 578, 29/580, 591; 148/175, 187; 156/643, 653, 657; 357/49, 50

[56] References Cited

U.S. PATENT DOCUMENTS

| | | | |
|---|---|---|---|
| 3,911,471 | 10/1975 | Kooi et al. | 148/175 X |
| 4,233,091 | 11/1980 | Kawabe | 29/576 W X |
| 4,343,080 | 8/1982 | Hataishi et al. | 29/576 W X |
| 4,376,664 | 3/1983 | Hataishi et al. | 29/578 X |
| 4,378,260 | 3/1983 | Fukuda et al. | 29/578 X |

Primary Examiner—William G. Saba
Attorney, Agent, or Firm—Staas & Halsey

[57] ABSTRACT

In a process for producing a semiconductor device, having a thick silicon oxide layer, on an isolation region, an oxide layer is selectively formed on an area for providing the isolation region of the epitaxial layer. Then an anti-oxidation masking layer is selectively formed on the oxide layer. The semiconductor substrate is selectively oxidized using the anti-oxidation masking layer for forming the thick silicon oxide layer. The anti-oxidation masking layer on the silicon oxide layer, which corresponds to the area for providing the isolation region, is removed and impurities are introduced into the area for providing the isolation region. Then the semiconductor substrate is oxidized in an oxidizing atmosphere so that the impurities are activated to form an isolation region and an oxide layer on the isolation region, the oxide layer having an increased thickness. The thus-obtained thick silicon dioxide layer makes the parasitic capacitance between the conductive lines and the isolation region small.

11 Claims, 8 Drawing Figures

Fig. I(a)
(PRIOR ART)
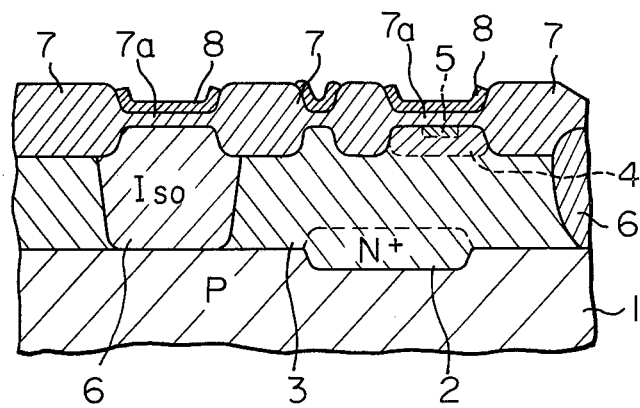
Fig. I(b)
(PRIOR ART)
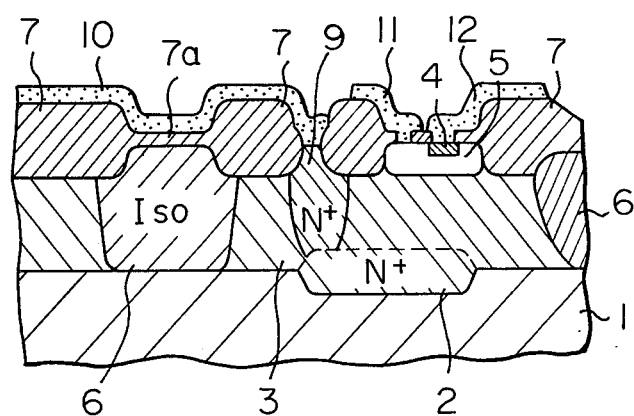

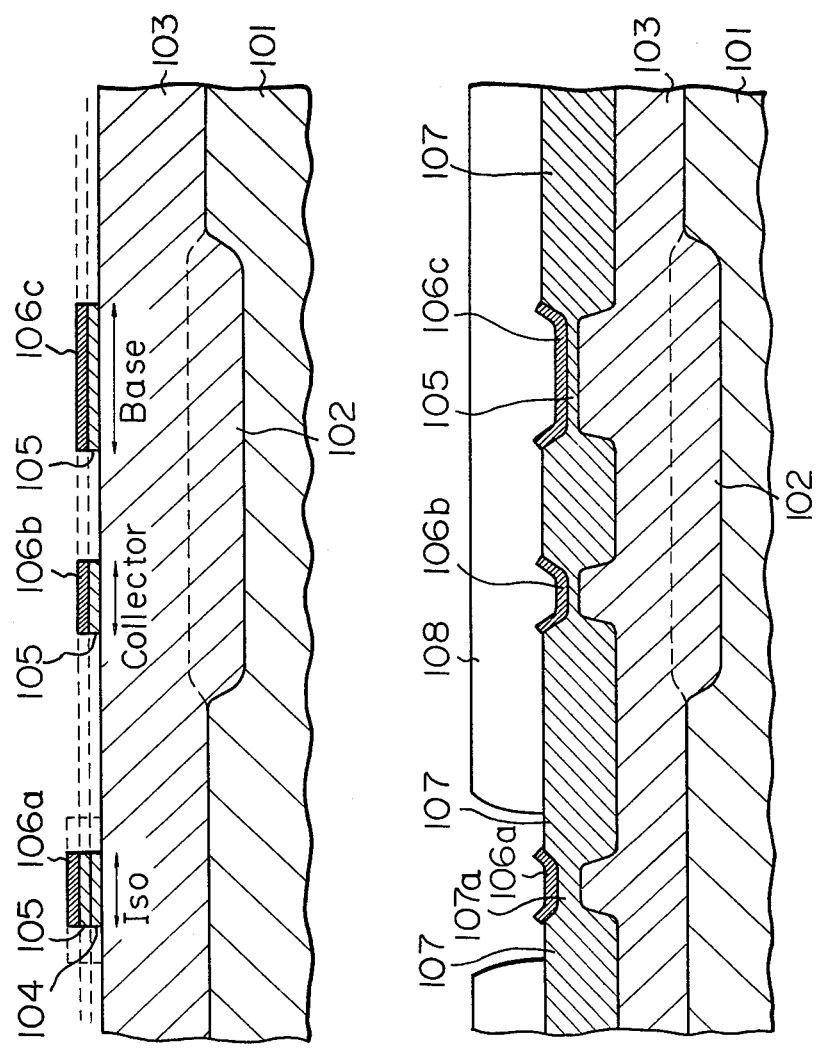

METHOD OF PRODUCING A SEMICONDUCTOR DEVICE

BACKGROUND OF THE INVENTION (1) Field of the Invention

The invention relates to a method for producing a semiconductor device. More specifically, it relates to a method for producing a semiconductor device in which the undesirable etching of an oxide layer on an isolation region of a semiconductor substrate and of an underlayer thereof is prevented during the process of preparing a thick oxide layer on the isolation region.

(2) Description of the Prior Art

In the case of a semiconductor integrated circuit such as a bipolar semiconductor integrated circuit, the technique for surrounding a region with a thick field oxide layer so as to form active or passive elements of the circuit has been developed. Such a semiconductor integrated circuit is illustrated in a schematic sectional view in FIG. 1. In FIG. 1(a), FIG. 1(b), and FIG. 2, the same reference numbers denote the same portions. Reference number 1 indicates a P-type silicon (Si) substrate. Reference number 2 indicates an N+-type buried layer. Reference number 3 denotes an N-type silicon epitaxial layer. A P-type base region 4 and N+-type emitter region 5 are formed in the epitaxial layer 3. Reference number 6 denotes a P-type isolation region surrounding regions 4 and 5. The P-type isolation region 6 surrounding the element region has an island shape. Reference number 7 denotes an insulating layer formed by a silicon dioxide ($SiO_2$) layer about 800 nm in thickness. Reference number 7a denotes a silicon dioxide layer about 100~150 nm in thickness. Reference number 8 designates a silicon nitride ($Si_3N_4$) used as a mask when silicon dioxide is formed by the selective oxidation method. The semiconductor integrated circuit is completed by forming a collector contact region 9, a collector electrode 10, a base electrode 11, an emitter electrode 12, and conductive lines (not shown), respectively.

It is possible to decrease the parasitic capacitance between the epitaxial layer and the conductive lines by forming the above-mentioned insulating layer 7. By using this method, it is possible to selectively oxidize the epitaxial layer 3, keeping the silicon nitride layer 8 on the base region 4, the isolation region 6 and on the collector contact region 9. It is possible to form other elements such as a resistor and a diode by a self-alignment process.

The region formed of a passive element or an active element in the semiconductor integrated circuit, which is prepared by the above-mentioned method, is surrounded by an isolation region having an island shape. Therefore, the conductive lines are formed over the isolation region. As illustrated in FIG. 1(b), when the collector electrode (the conductive line) 10 is formed over the isolation region 6, the silicon dioxide layer 7a is formed on the isolation region 6. However, the thickness of the silicon dioxide layer 7a is thin, namely 100~150 nm in thickness. Therefore, the parasitic capacitance C between the conductive line 10 and the isolation region 6 increases so that the switching speed of the thus-produced semiconductor integrated circuit becomes slow. In order to make the parasitic capacitance C small and to make the switching speed fast, it has been attempted to make the silicon dioxide layer 7a on the isolation region 6 thick.

FIG. 2 is another means for making the parasitic capacitance C small. According to the means, a high concentration of P-type impurities (acceptors, e.g., boron) are introduced through the silicon dioxide layer 7 by ion implantation to form a P+-type isolation region 6a (FIG. 2). However, this has a drawback in that it is impossible to make the patterning small since the P+-type isolation region 6a is not formed by a self-alignment process.

According to the prior art for forming an isolation region by using a self-alignment process, a photoresist layer 13 is coated on the entire surface of the silicon dioxide layer 7, as is illustrated in FIG. 3 (the reference numbers in FIG. 3 designate the same elements as those in FIG. 1), after the first selective oxidation is completed. Then a portion of the photoresist layer 13, corresponding to an isolation region to be formed, is removed. This is followed by introducing impurities through the silicon dioxide layer 7a into the epitaxial layer 3 by ion implantation in order to form the isolation region. In the case of introducing impurities into the epitaxial layer 3, the silicon nitride layer 8 is removed in advance since certain impurities cannot be introduced into the epitaxial layer if the silicon nitride layer is present.

In order to remove the silicon nitride layer 8, a plasma etching method is employed wherein the etchant is, for example, carbon tetrafluoride ($CF_4$). By using this method, the silicon nitride layer 8 is etched as shown in FIG. 3. One portion of the silicon nitride layer 8 can be etched by employing the above-mentioned etching process. However, one portion of the epitaxial layer 3 below the silicon nitride layer 8 can be undesirably etched, and, in an extreme case, one portion of the epitaxial layer 3 can be hollowed out.

SUMMARY OF THE INVENTION

It is an object of the present invention to provide a new method of producing a semiconductor device having a thick silicon dioxide layer in order to make the parasitic capacitance between the conductive line and the isolation region small.

According to the present invention, there is provided a method of producing a semiconductor device comprising an epitaxial layer of a first conductivity type on a semiconductor substrate of a second conductivity type opposite to the first conductivity type and an isolation region of the second coductivity type. The isolation region reaches to the semiconductor substrate from the surface of the epitaxial layer. The method comprises the steps of:

selectively forming an oxide layer on an area for providing the isolation region of the epitaxial layer;

selectively forming an anti-oxidation masking layer on the oxide layer and the desired region of the epitaxial layer;

selectively oxidizing the epitaxial layer by using the anti-oxidation masking layer as a mask;

removing a portion of the anti-oxidation masking layer on the oxide layer corresponding to area for providing the isolation providing region;

introducing impurities of the second conductivity type into area for providing the isolation region; and oxidizing the epitaxial layer in an oxidizing atmosphere by using the remaining portions of said antioxidation masking layer as a mask.

According to the present invention, it is possible to form and position, on an isolation region, an insulating layer sufficiently thicker than that on another region (an element region). This is done by selectively forming a predetermined thick insulating layer (a silicon dioxide layer) on an area for providing the isolation region of the epitaxial layer, by selective oxidation so as to form a field insulating layer and by oxidizing the epitaxial layer in an oxidizing atmosphere after introducing the impurities so as to form the isolation region. Therefore, it is possible to prevent the occurrence of a large parasitic capacitance between the isolation region and the conductive lines on the isolation layer. Also, it is possible to more effectively increase the signal propagation speed.

BRIEF DESCRIPTION OF THE DRAWINGS

FIG. 1(a) and FIG. 1(b) are schematic sectional views of a bipolar transistor of an integrated circuit produced by a known method;

FIGS. 4(a) through 4(d) are schematic sectional views of a bipolar transistor in the intermediate stages of production in accordance with an embodiment of the present invention.

DESCRIPTION OF THE PREFERRED EMBODIMENT

Figure 2:
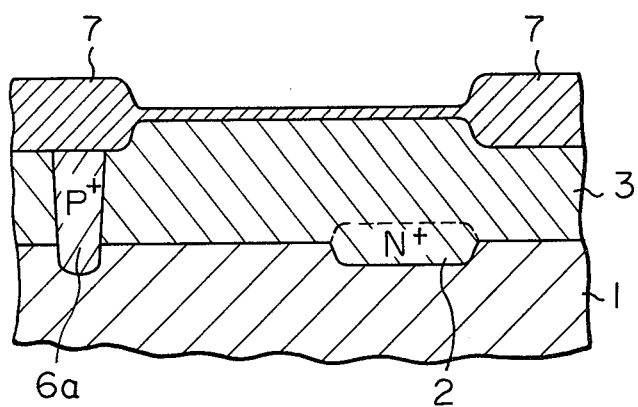
FIG. 2 is a schematic sectional view of a bipolar transistor of an integrated circuit produced by another known method.
Figure 3:
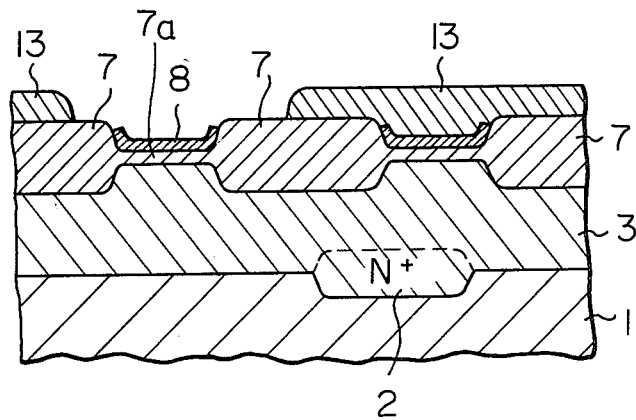
FIG. 3 is a schematic sectional view of the bipolar transistor of FIG. 1 in a major stage of production by a known method.

The present invention will now be explained in detail in accordance with the following embodiment, with reference to the drawings.

Referring to the attached drawings, in FIGS. 4(a) through 4(d), there are shown schematic sectional views of a bipolar transistor in the intermediate stages of production in accordance with an embodiment of the present invention.

An N-type epitaxial layer 103 is formed on a P-type silicon (Si) semiconductor substrate 101 having an N+-type buried layer 102 in accordance with a known method. The thickness of epitaxial layer 103 is 2 μm.

A first silicon dioxide layer 104 is formed on the whole epitaxial layer 103 to a thickness of about 50 nm. Then patterning of the first silicon dioxide layer 104 is carried out so that the first silicon dioxide layer 104 remains on only the isolation region to be formed, as shown in FIG. 4(a). A second silicon dioxide layer 105 having a thickness of approximately 30 nm is formed on the first silicon dioxide layer 104 and on the epitaxial layer 103 by a chemical vapor deposition method.

Then, a silicon nitride layer 106 having a thickness of approximately 70 nm and serving as an anti-oxidation masking layer is formed on the second silicon dioxide layer 105 by a chemical vapor deposition method. The silicon nitride layer 106 is selectively etched by a photoetching method to form a patterned silicon nitride layer which corresponds to an isolation region, a base region and a collector contact region to be formed, as is illustrated in FIG. 4(a). Then the second silicon dioxide layer 105 is selectively etched using the silicon nitride layer 106 as a masking layer. The first silicon dioxide layer 104 over the isolation region to be formed is also selectively etched. The etched silicon dioxide layers 104 and 105, as well as the etched silicon nitride layer 106, are illustrated by the dotted lines in FIG. 4(a). In FIG. 4(a), the silicon nitride layer 106a is selectively positioned over the area for providing the isolation region, the silicon nitride layer 106b is selectively positioned over the area for providing the collector contact region and the silicon nitride layer 106c is selectively positioned over the area for providing the base region.

Next, the thus-obtained semiconductor body is heated at about 1000° C. for fifty minutes in an oxidizing atmosphere including steam and oxygen (wet $O_2$), using the silicon nitride layer 106 as a masking layer. As a result of the heat treatment, i.e., a selective oxidation process, a silicon dioxide layer (field insulating layer) 107 having a thickness of about 400 nm is formed on the surface of the epitaxial layer 103, as illustrated in FIG. 4(b). In FIG. 4(b), a silicon dioxide layer 107a comprises the first and second silicon dioxide layers 104 and 105 and has a thickness of 80 nm, i.e., 50 nm plus 30 nm. Therefore, the thickness of the silicon dioxide layer 107a is thicker than that of the silicon dioxide layer (being equal to 30 nm) on the area for providing the base region and on the area for providing the collector region, by the thickness of the first silicon dioxide layer (being equal to 50 nm).

The photoresist layer 108 is then coated on the surface of the whole silicon dioxide layer 107, the silicon nitride layer 106c on the area for providing the base region, the silicon nitride layer 106b on the area for providing the collector contact region, and on the silicon nitride layer 106a on the area for providing the isolation region.

The photoresist layer 108 is exposed and developed to form an opening in the isolation region, positioned above the isolation region to be formed.

The silicon nitride layer 106a, located above the isolation region to be formed, is then selectively etched by employing a plasma etching process, using $CF_4$ as an etchant. Thus, since the thick silicon dioxide layer 107a has a thickness of 80 nm on the isolation region to be formed, the above mentioned undesirable etching of the epitaxial layer 103 below the silicon dioxide layer 107a does not occur.

Next, P-type impurities (e.g., boron) are introduced through the opening of the photoresist layer 108 serving as a mask, into the epitaxial layer 103 by ion implantation to form a P-type high-concentration region. Ion implantation is carried out by using an acceleration voltage of 35 kev and a dose rate of $5 \times 10^{15}$ cm$^{-2}$, not taking into consideration the impurities introduced through the portion of the silicon dioxide layer 107 into the epitaxial layer. The photoresist layer 108 is removed.

Figure 4C:
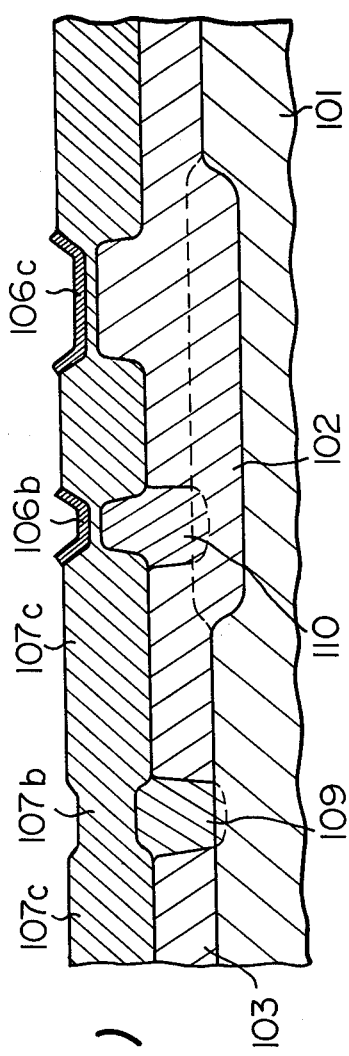

Next, the silicon dioxide layer 107a is again oxidized in an oxidizing atmosphere including steam and oxygen (wet $O_2$) at a temperature of 1000° C. for one hundred and fifty-five minutes to form a thick silicon dioxide layer 107b having a thickness of approximately 700 nm, as illustrated in FIG. 4(c), by using the silicon nitride layer 106 as a oxidation mask. In this thermal oxidation process, the thickness of the silicon dioxide layer 107 is increased to a thickness of approximately 820 nm to form a silicon dioxide layer 107c, as illustrated in FIG. 4(c). The thickness of the silicon dioxide layer 107c is calculated on the basis of the following: $((700)^2+(400)^2)^{\frac{1}{2}} \approx 820$ (nm). In this case, the difference between the thickness of the silicon dioxide layer 107c and the thickness of the silicon dioxide layer 107b is nm, calculated on the basis of the following expression: $(820 - 700) \times 0.55$.

Then N-type impurities (donor atoms, e.g., phosphorus) are introduced through the silicon nitride layer 106b into the epitaxial layer 103 by ion implantation to form an N-type high-concentration region by using a known method. Ion implantation is carried out by using an acceleration voltage of 120 keV and a dose rate of $2 \times 10^{15}$ cm$^{-2}$.

Next, the thus-obtained semiconductor body is annealed at 1150° C. for forty minutes in a nitrogen (N$^2$) atmosphere. As a result of the heat treatment, the P-type impurities (acceptor) in the high concentration region diffuse into the epitaxial layer 103 and arrive at the silicon semiconductor substrate 101 to form an isolation region 109. Simultaneously, the donor impurities in the high concentration region diffuse and arrive at the N+-type buried layer 102 to form a collector contact region 110, as illustrated in FIG. 4(c).

Then the silicon nitride layer 106b and the silicon nitride layer 106c are removed by a wet etching method by using boiled phosphoric acid.

Figure 4D:
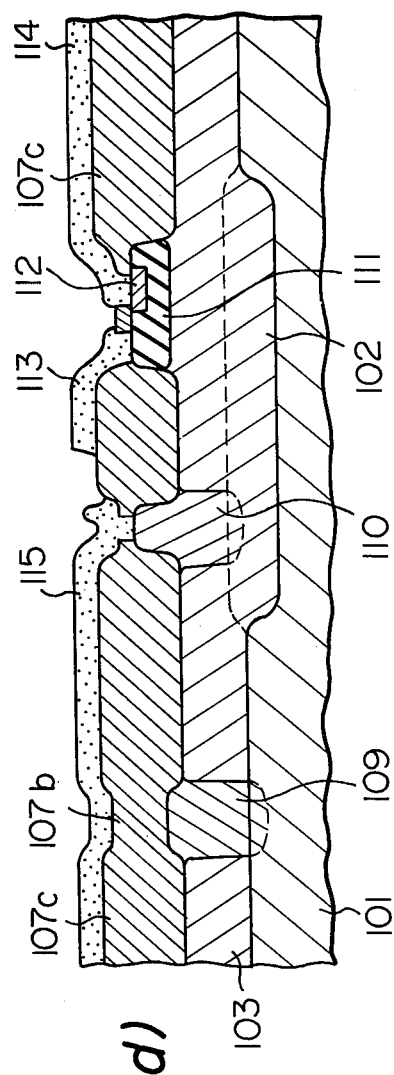

In order to complete the bipolar transistor, a P-type base region 111, an N+-type emitter region 112, a base electrode 113, an emitter electrode 114, and a collector electrode (conductive lines) 115 are formed in accordance with a prior art method, as illustrated in FIG. 4(d). The base region 111 is formed by introducing impurities such as boron into the surface region of the epitaxial layer 103 corresponding to the area for providing the base region, after removal of the silicon nitride layer 106c by a conventional impurity diffusion process or ion implantation. Next, the insulating layer (silicon dioxide layer) on the portion corresponding to the collector contact region 110, the base region 111, and the emitter region 112, is removed by utilizing a conventional photo-lithography process to form windows. Thereafter, a layer of conductive material, such as aluminum (Al), about one micrometer in thickness, is deposited, followed by patterning, utilizing the photolithography process, to form a base electrode, an emitter electrode, and a collector electrode (the conductive lines). Next, a surface protective layer (passivation layer, not shown) comprising phosphosilicate glass (PSG), for example, is formed on the conductive lines. Also, if necessary, multilayer wiring may be formed over the conductive layer with an interlayer insulating layer, comprising the PSG layer or the silicon dioxide layer, interposed between the wiring and the conductive layer.

In the bipolar transistor according to the present invention, there exists the silicon dioxide layer 107b having a thickness of about 700 nm between conductive lines 114 and the epitaxial layer 103 corresponding to the isolation region 109. Therefore, the parasitic capacitance between conductive lines 114 and the isolation region 109 is smaller than the parasitic capacitance generated by the structure of the known bipolar transistor. Hence, the switching speed of the semiconductor integrated circuit produced by this invention is faster than that of the semiconductor integrated circuit produced by the known method. As mentioned before, the difference between the thickness of the silicon dioxide layer 107c and the thickness of the silicon dioxide layer 107b is 66 nm. Therefore, the possibility of breakage of the conductive lines 115 is remarkably decreased. Furthermore, since undesirable etching of the epitaxial layer 103 under the silicon dioxide layer 107b does not occur, the special characteristics of a semiconductor integrated circuit can be maintained and can be prevented from being impaired.

In this embodiment, the second silicon dioxide layer 105 functions as a buffered layer. The second silicon dioxide layer 105 might prevent the occurrence of crystal defects in the epitaxial layer 103 under the silicon nitride layer 106 when the semiconductor substrate is thermally oxidized.

It will be obvious that the present invention is not restricted to the above-mentioned embodiment, and many variations are possible for those skilled in the art without departing from the scope of the present invention. For example, it is possible to use a PNP-type bipolar transistor instead of an NPN-type bipolar transistor.

I claim:

1. A method for producing a semiconductor device comprising an epitaxial layer of a first conductivity type formed on a semiconductor substrate of a second conductivity type opposite to the first conductivity type and an isolation region of the second conductivity type, the isolation region reaching to the semiconductor substrate from the surface of the epitaxial layer, said method comprising the steps of:
   (a) selectively forming a first oxide layer having a first thickness, on an area of the epitaxial layer to provide an isolation region in the epitaxial layer;
   (b) selectively forming a second oxide layer having a second thickness, on a predetermined region of the epitaxial layer, the first thickness being greater than the second thickness;
   (c) selectively forming an anti-oxidation masking layer on the second oxide layer;
   (d) selectively oxidizing the epitaxial layer by using the anti-oxidation masking layer as a mask;
   (e) selectively forming a photo-resist layer so as to expose the anti-oxidation masking layer formed on the first and second oxide layers through the photo-resist layer;
   (f) removing the exposed anti-oxidation masking layer by dry etching;
   (g) introducing second conductivity-type impurities into the area for providing the isolation region;
   (h) oxidizing the epitaxial layer in an oxidizing atmosphere by using the remaining portions of the anti-oxidation masking layer as a mask.

2. A method as claimed in claim 1, wherein the anti-oxidation masking layer is a silicon nitride layer.

3. A method as claimed in claim 1, wherein said oxidizing step (d) is carried out at a temperature of approximately 1000° C. for fifty minutes and wherein said oxidizing step (f) is carried out at approximately 1000° C. for one hundred and forty-five minutes.

4. A method as claimed in claim 1, wherein said step (f) of removing the exposed anti-oxidation masking layer comprises a dry etching removal method.

5. A method for producing a semiconductor device having a semiconductor substrate of a second conductivity type, having an epitaxial layer including first, second and third areas of a first conductivity type opposite that of the second conductivity type formed on the semiconductor substrate and having a buried layer of the first conductivity type formed in the semiconductor substrate, the method comprising the steps of:
   (a) forming a first oxide layer on the first area of the epitaxial layer;

(b) forming a second oxide layer on the first oxide layer and on the second and third areas of the epitaxial layer;

(c) selectively forming an anti-oxidation masking layer on the second oxide layer to obtain the first and second oxide layers and the anti-oxidation masking layer on the first area, and to obtain the second oxide layer and the anti-oxidation masking layer on the second area;

(d) selectively oxidizing the semiconductor device to form a field insulating layer on the epitaxial layer, a portion of the field insulating layer comprising the first and second oxide layers;

(e) selectively covering the field insulating layer with a photoresist layer to form an opening in which the anti-oxidation masking layer, formed over the first layer, is exposed;

(f) removing the exposed anti-oxidation masking layer by dry etching so as to form an opening;

(g) introducing impurities of the second conductivity type into the epitaxial layer through the opening;

(h) oxidizing a portion of the field insulating layer to form a thick field insulating layer;

(i) introducing impurities of the first conductivity type into the epitaxial layer under the second area;

(j) annealing the semiconductor device so that the impurities of the second conductivity type diffuse into the epitaxial layer to form an isolation region under the first area and the impurities of the first conductivity type diffuse into the buried layer to form a collector contact region under the second area.

6. A method as claimed in claim 5, wherein said step (a) comprises forming the first oxide layer having a thickness of approximately 50 nanometers, and wherein said step (b) comprises forming the second oxide layer having a thickness of approximately 30 nanometers.

7. A method as claimed in claim 6, wherein step (c) comprises forming the anti-oxidation mask having a thickness of approximately 70 nanometers.

8. A method as claimed in claim 5, wherein said step (d) comprises forming the field insulating layer having the portion comprising the first and second oxide layers having a thickness of approximately 80 nanometers and the remaining portions having a thickness of approximately 400 nanometers.

9. A method as claimed in claim 5, wherein said step (h) comprises forming the thick field insulating layer having a thickness of approximately 820 nanometers.

10. A method as claimed in claim 5, wherein said step (g) comprises introducing the impurities of the second conductivity type using an acceleration voltage of 35 kev and a dose rate of $5 \times 10^{15} cm^{-2}$.

11. A method as claimed in claim 5, wherein said step (i) comprises introducing the impurities of the first conductivity type using an acceleration voltage of 120 kev and a dose rate of $2 \times 10^{15} cm^{-2}$.

* * * * *

UNITED STATES PATENT AND TRADEMARK OFFICE
CERTIFICATE OF CORRECTION

PATENT NO. : 4,473,940

DATED : OCTOBER 2, 1984

INVENTOR(S) : TADASHI KIRISEKO

It is certified that error appears in the above-identified patent and that said Letters Patent is hereby corrected as shown below:

Col. 2, line 50, "coductivity" should be --conductivity--;
line 62, after "to" insert --the--;
line 63, delete "providing";
line 65, after "into" insert --the--;
line 67, "said" should be --the--.

Col. 4, line 16, "107acomprises" should be --107a comprises--.

Col. 5, line 48, "layer," should be --layer--.

Signed and Sealed this

Nineteenth Day of March 1985

[SEAL]

Attest:

DONALD J. QUIGG

Attesting Officer

Acting Commissioner of Patents and Trademarks